US006630255B1

(12) United States Patent
Litvinov et al.

(10) Patent No.: US 6,630,255 B1
(45) Date of Patent: Oct. 7, 2003

(54) MULTILAYER PERPENDICULAR MAGNETIC RECORDING MEDIA WITH EXCHANGE DECOUPLED SPACER LAYERS

(75) Inventors: Dmitri Litvinov, Pittsburgh, PA (US); Sakhrat Khizroev, Pittsburgh, PA (US)

(73) Assignee: Seagate Technology LLC, Scotts Valley, CA (US)

(*) Notice: Subject to any disclaimer, the term of this patent is extended or adjusted under 35 U.S.C. 154(b) by 83 days.

(21) Appl. No.: 09/816,815

(22) Filed: Mar. 23, 2001

Related U.S. Application Data
(60) Provisional application No. 60/192,050, filed on Mar. 24, 2000.

(51) Int. Cl.$^7$ .............................. G11B 5/66; G11B 5/70; H01J 1/00; C25D 5/26; B32B 15/01
(52) U.S. Cl. .............................. 428/694 TM; 428/216; 428/336; 428/611; 428/668; 428/670; 428/672; 428/678; 428/900; 427/131; 427/132
(58) Field of Search .................. 428/694 TM, 336, 428/216, 900, 611, 668, 670, 672, 678; 427/131, 132

(56) References Cited

U.S. PATENT DOCUMENTS

| | | | | |
|---|---|---|---|---|
| 5,750,270 A | * | 5/1998 | Tang et al. | 428/611 |
| 5,834,085 A | * | 11/1998 | Lairson et al. | 428/65.3 |
| 5,989,728 A | * | 11/1999 | Coffey et al. | 428/611 |
| 6,331,364 B1 | * | 12/2001 | Baglin et al. | 428/694 T |
| 6,403,203 B2 | * | 6/2002 | Futamoto et al. | 428/212 |

* cited by examiner

*Primary Examiner*—Holly Rickman
(74) *Attorney, Agent, or Firm*—Alan G. Tower, Esq.; Pietragallo, Bosick & Gordon

(57) ABSTRACT

Materials including alternating magnetic layers and spacer layers for use as a hard magnetic recording layer of a magnetic recording media are disclosed. The spacer layers as well as the magnetic layers are exchange decoupled. The spacer and magnetic layers include additives which are present in grain boundary regions throughout the layers. In a particular embodiment, the magnetic layers comprise Co, the spacer layers comprise Pd, and the additives comprise Cr, Pt, B, Ta, Nb or combinations thereof. In addition to forming grain boundaries that exchange decouple the magnetic and spacer layers, the additives may act as grain refiners.

37 Claims, 1 Drawing Sheet

MULTILAYER PERPENDICULAR MAGNETIC RECORDING MEDIA WITH EXCHANGE DECOUPLED SPACER LAYERS

CROSS REFERENCE TO RELATED APPLICATION

This application claims the benefit of U.S. Provisional Patent Application Ser. No. 60/192,050 filed Mar. 24, 2000.

FIELD OF THE INVENTION

The present invention relates to perpendicular magnetic recording media, and more particularly relates to multilayer media including exchange decoupled spacer layers.

BACKGROUND INFORMATION

Perpendicular magnetic recording systems have been developed for use in computer hard disk drives. A typical perpendicular recording head includes a trailing main pole, a leading return pole magnetically coupled to the main pole, and an electrically conductive magnetizing coil surrounding the main pole. The bottom of the return pole has a surface area greatly exceeding the surface area of the tip of the main pole. Conventional perpendicular recording media typically include a hard magnetic recording upperlayer and a soft magnetic underlayer which provides a flux path from the trailing write pole to the leading return pole of the writer.

During recording operations, the perpendicular recording head is separated from the magnetic recording media by a distance known as the flying height. The magnetic recording media is moved past the recording head so that the recording head follows the tracks of the magnetic recording media, with the magnetic recording media first passing under the return pole and then passing under the main pole. Current is passed through the coil to create magnetic flux within the main pole. The magnetic flux passes from the main pole tip, through the hard magnetic recording track, into the soft underlayer, and across to the return pole.

One of the strongest candidates for perpendicular magnetic recording media includes a multilayer structure. Among the advantages of multilayers are easily adjusted anisotropy by varying the thickness of the layers in the bi-layer structure, and a remanence squareness equal to one which ensures media with substantially no DC noise.

Multilayer-based perpendicular media is subject to a problem associated with conventional magnetic recording media. The magnetic grains must be exchange decoupled in order to improve signal-to-noise ratio (SNR). A typical multilayer recording structure comprises multiple repetitions of Co/Pt or Co/Pd bi-layers which develop strong perpendicular anisotropy. The magnetic layers of the deposited films are granular, with each magnetic grain having a differing composition through its cross section. For these magnetic grains to be able to switch magnetization direction independently of each other (thus increasing SNR), they have to be exchange decoupled.

A solution to this problem has been suggested recently by adding elements such as chromium to a magnetic layer such as Co in the bi-layer structure. Although this approach may help to exchange decouple the magnetic Co grains to some extent, since the non-magnetic Pt and Pd used in perpendicular anisotropy multilayer are highly polarizable elements, the exchange coupling will persist through the Pd or Pd spacer layers.

The present invention has been developed in view of the foregoing, and to address other deficiencies of the prior art.

SUMMARY OF THE INVENTION

The present invention effectively exchange decouples grains throughout a multilayer perpendicular magnetic recording structure and also controls the grain size throughout the multilayer structure. In accordance with the present invention, additives such as B, Cr, $SiO_2$, etc. are added to the non-magnetic spacer layers of a multilayer recording structure, as well as to the magnetic layers, in order to decouple grains throughout the entire multilayer structure. Such decoupling in both the non-magnetic spacer layers as well as the magnetic layers not only controls exchange coupling between the grains, but also provides a mechanism to control the grain size.

An aspect of the present invention is to provide a magnetic recording media comprising a substrate and a hard magnetic recording layer on the substrate comprising alternating layers of magnetic material and spacer material, wherein the spacer material is exchange decoupled.

Another aspect of the present invention is to provide a magnetic recording material comprising alternating layers of magnetic material and spacer material, wherein the spacer material is exchange decoupled.

A further aspect of the present invention is to provide a method of making a magnetic recording material. The method comprises depositing alternating layers of exchange decoupled magnetic material and exchange decoupled spacer material.

These and other aspects of the present invention will be more apparent from the following description.

DETAILED DESCRIPTION

Figure 1:
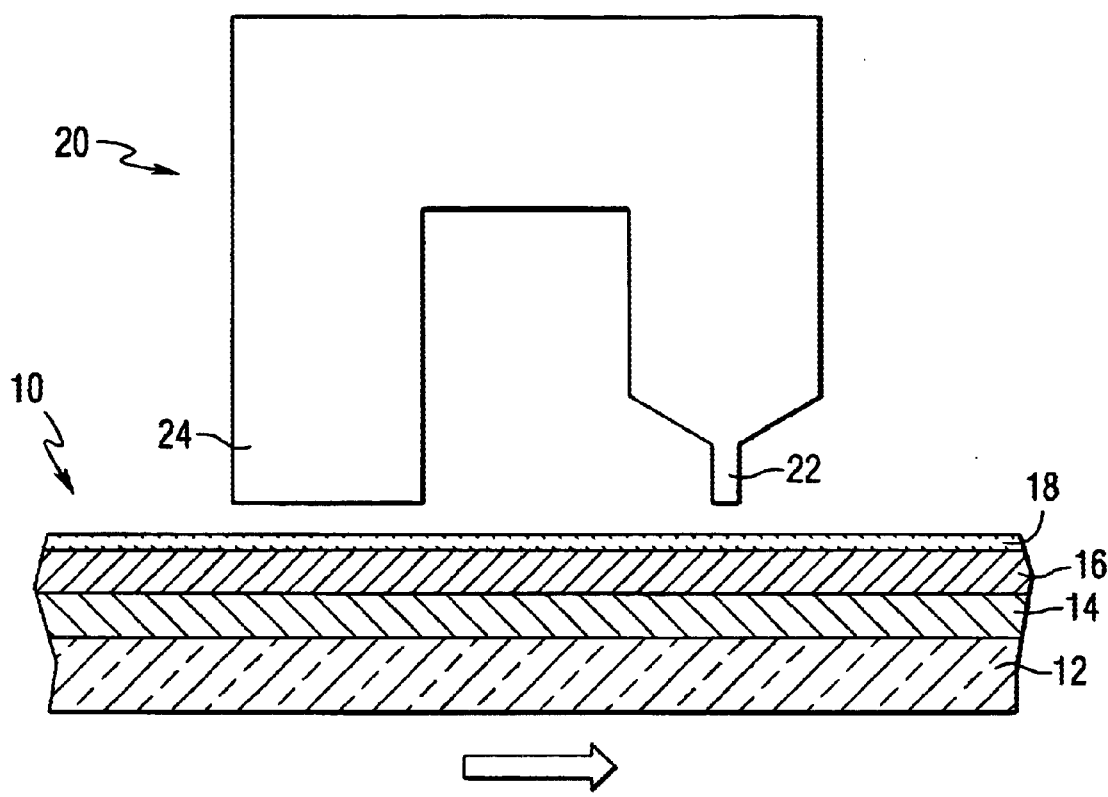
FIG. 1 is a partially schematic side sectional view of a perpendicular magnetic recording head and perpendicular magnetic recording media. The recording media includes a hard magnetic recording layer comprising a multilayer structure in accordance with the present invention.

FIG. 1 is a partially schematic side sectional view of a perpendicular magnetic recording medium 10. The medium 10 includes a substrate 12, which may be made of any suitable material such as ceramic glass, amorphous glass or NiP plated AlMg. A magnetically soft underlayer 14 is deposited on the substrate 12. Suitable soft magnetic materials for the underlayer 14 include CoFe and alloys thereof, FeAlN, NiFe, CoZrNb and FeTaN, with CoFe and FeAlN being typical soft materials. A magnetically hard recording layer 16 comprising a multilayer structure of the present invention is deposited on the soft underlayer 14. A magnetic exchange decouple layer (not shown) may be provided between the layers 14 and 16. A protective overcoat 18 such as diamond-like carbon may be applied over the recording layer 16.

FIG. 1 also illustrates a perpendicular recording head 20 positioned above the magnetic recording medium 10. The recording head 20 includes a main pole 22 and an opposing pole 24. During recording operations, magnetic flux is directed from the main pole 22 perpendicularly through the recording layer 16, then in the plane of the soft underlayer 14 back to the opposing pole 24.

In accordance with an embodiment of the present invention, the recording layer 16 comprises a multilayer structure including alternating layers of magnetic material and non-magnetic spacer material. Both the magnetic layers and the spacer layers are exchange decoupled. As used herein, the term "exchange decoupled" means a material in which quantum mechanical exchange coupling between adjacent grains is reduced. The term "magnetic layer" means a layer made of ferromagnetic material. The term "spacer layer" means a layer comprising a substantially non-ferromagnetic material.

Figure 2:
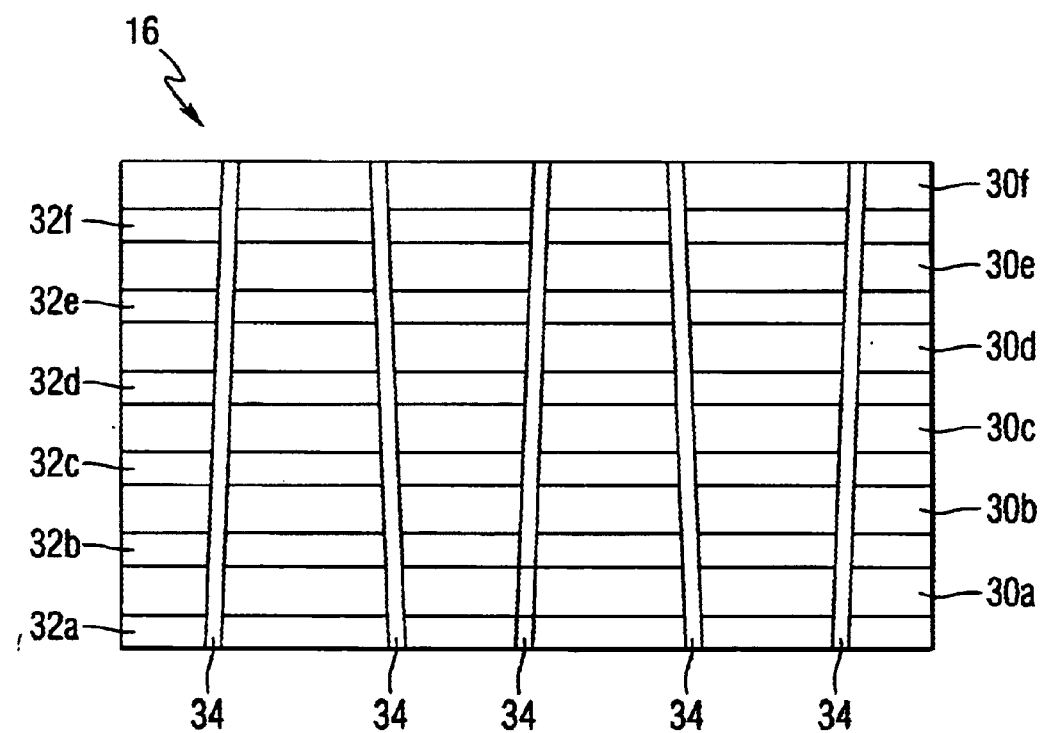
FIG. 2 is a partially schematic side sectional view of a hard magnetic recording multilayer structure, including exchange decoupled magnetic layers and exchange decoupled spacer layers in accordance with the present invention.

An example of a multilayer structure is illustrated in FIG. 2. The magnetic recording layer 16 comprises alternating layers of magnetic material 30a–30f and spacer material 32a–32f. In accordance with an embodiment of the present invention, both the magnetic layers 30a–30f and spacer layers 32a–32f are exchange decoupled by grain boundary regions 34 which extend through the alternating layers. The grain boundary regions 34 effectively exchange decouple the spacers layers 32a and 32f, as well as the magnetic layers 30a–30f.

The magnetic layers 30a–30f may comprise at least one metal selected from Co, Ni and Fe, with Co being a typical magnetic material. The spacer layers 32a–32f may comprise at least one metal selected from Pd, Pt and Au, with Pd and Pt being particularly suitable spacer materials. Additives in total amounts of from about 0.001 to about 30 weight percent may be added to the magnetic and spacer layers. The exchange decoupling additives which may be added to the magnetic and spacer layers may include Cr, Pt, B, Ta, Nb, Y, La, rare earth elements and $SiO_2$. Typical additives include Cr, Pt, B, Ta, Nb and combinations thereof. The microstructure of the recording layer 16 may comprise multilayer grains of the magnetic and spacer materials at least partially surrounded by regions containing relatively large amounts of the additive(s), e.g., B-rich regions, Cr-rich regions, $SiO_2$-rich regions, etc.

Each magnetic layer 30a–30f typically has a thickness of from about 0.1 to about 10 nm. Each spacer layer 32a–32f may have a thickness of from about 1 to about 20 nm. Each grain boundary region 34 may have a thickness of from about 0.1 to about 2 nm.

Although the multilayer structure shown in FIG. 2 comprises six magnetic layers 30a–30f and six spacer layers 32a–32f, any suitable number of layers may be used. For example, the multilayer structure may include from 2 to 40 layers of each of the magnetic material and spacer material.

In addition to promoting exchange decoupling in the spacer layers 32a–32f, the present additives may also act as grain refiners for the magnetic and spacer layers. The magnetic and spacer layers 30a–30f and 32a–32f may have an average grain size of less than about 20 nm. Typical average grain sizes of the magnetic and spacer layers 30a–30f and 32a–32f range from about 3 to about 12 nm.

Examples of particularly suitable multilayer structures include (CoB/PdB)xN and (CoCrB/PdCrB)xN, where B and Cr are low percentage additives and N may range from 1 to 40, typically from 1 to 10. Each spacer layer may comprise a monolithic material such as Pd plus additive(s), or may alternatively comprise a structured material such as Pd/Pt/Pd. Each spacer layer may comprise the same composition and thickness. Alternatively, different spacer layer compositions and/or thicknesses may be used. Similarly, the compositions and thicknesses of the magnetic layers may be the same or different.

The present multilayer structure may be made by deposition techniques such as sputtering, evaporation or molecular beam epitaxy (MBE). Deposition may be carried out, for instance, at room temperature or at elevated temperatures of, e.g., from about 150 to about 250° C. For example, the alternating layers of the magnetic material 30a–32f and spacer material 32a–32f shown in FIG. 2 may be deposited by sputtering the desired number of atomic layer(s) of each material onto a rotating substrate. Commercially available dc or rf magnetron sputtering systems utilizing sputtering targets in a variety of shapes and sizes and Ar, Kr and/or Xe inert sputtering gas may be suitable, for fabricating such multilayers. After the multilayers have been deposited, the multilayer structure may optionally be annealed in order to control the grain structures of the layers. Typical annealing operations may be carried out at temperatures of from about 150 to about 350° C. or higher, for times of from about 1 minute to about 2 hours, depending on the type of material and desired grain structure.

Whereas particular embodiments of this invention have been described above for purposes of illustration, it will be evident to those skilled in the art that numerous variations of the details of the present invention may be made without departing from the invention as defined in the appended claims.

What is claimed is:

1. A magnetic recording media comprising:
   a substrate; and
   a hard magnetic recording layer on the substrate comprising alternating layers of magnetic material and spacer material, wherein the layers of magnetic material consist essentially of magnetic grains and the layers of spacer material comprise from about 0.001 to about 30 weight percent additives which form grain boundaries in the spacer material to thereby exchange decouple the spacer material.

2. The magnetic recording media of claim 1, wherein the magnetic layers comprise additives which exchange decouple the magnetic layers.

3. The magnetic recording media of claim 2, wherein the spacer layer additives and the magnetic layer additives are present in grain boundary regions in the layers.

4. The magnetic recording media of claim 3, wherein the grain boundary regions extend through the alternating magnetic and spacer layers.

5. The magnetic recording media of claim 2, wherein the spacer layer additives and the magnetic layer additives comprise a total of from about 0.001 to about 30 weight percent Cr, Pt, B, Ta, Nb, Y, La, rare earth elements, $SiO_2$, or combinations thereof.

6. The magnetic recording media of claim 2, wherein the spacer layer additives and the magnetic layer additives comprise Cr, Pt, B, Ta, Nb or combinations thereof.

7. The magnetic recording media of claim 1, wherein the magnetic layers comprise at least one metal selected from Co, Ni and Fe.

8. The magnetic recording media of claim 1, wherein the magnetic layers comprise Co.

9. The magnetic recording media of claim 1, wherein the spacer layers comprise at least one metal selected from Pd, Pt and Au.

10. The magnetic recording media of claim 1, wherein the spacer layers comprise Pd.

11. The magnetic recording media of claim 2, wherein the magnetic layers comprise at least one metal selected from Co, Ni and Fe, the spacer layers comprise at least one metal selected from Pd and Pt and the spacer layer additives and the magnetic layer additives comprise at least one material selected from Cr, Pt, B, Ta, Nb, Y, La, rare earth elements and $SiO_2$.

12. The magnetic recording media of claim 2, wherein the magnetic layers comprise Co, the spacer layers comprise Pd, and the spacer layer additives and the magnetic layer additives comprise at least one element selected from Cr and B.

13. The magnetic recording media of claim 2, wherein the spacer layer additives and the magnetic layer additives are substantially the same in both the magnetic layers and spacer layers.

14. The magnetic recording media of claim 1, wherein the magnetic and spacer layers have average grain sizes of less than about 20 nm.

15. The magnetic recording media of claim 1, wherein the spacer layers have average grain sizes of from about 1 to about 10 nm.

16. The magnetic recording media of claim 1, wherein the hard magnetic recording layer comprises from 2 to 10 layers of each of the magnetic material and spacer material.

17. The magnetic recording media of claim 1, wherein each magnetic layer has a thickness of from about 0.1 to about 10 nm, and each spacer layer has a thickness of from about 1 to about 20 nm.

18. The magnetic recording media of claim 1, further comprising a soft magnetic layer between the substrate and the hard magnetic recording layer.

19. The magnetic recording media of claim 1, wherein the magnetic recording media is a perpendicular magnetic recording media.

20. A magnetic recording material comprising alternating layers of magnetic material and spacer material, wherein the layers of magnetic material consist essentially of magnetic grains and the layers of spacer material comprise from about 0.001 to about 30 weight percent additives which form grain boundaries in the spacer material to thereby exchange decouple the spacer material.

21. The magnetic recording material of claim 20, wherein the magnetic layers comprise additives which exchange decouple the magnetic layers.

22. The magnetic recording material of claim 21, wherein the spacer layer additives and the magnetic layer additives are present in grain boundary regions in the layers.

23. The magnetic recording material of claim 22, wherein the grain boundary regions extend through the alternating magnetic and spacer layers.

24. The magnetic recording material of claim 21, wherein the magnetic layers comprise at least one metal selected from Co, Ni and Fe, the spacer layers comprise at least one metal selected from Pd and Pt, and the spacer layer additives and the magnetic layer additives comprise at least one material selected from Cr, Pt, B, Ta, Nb, Y, La, rare earth elements and $SiO_2$.

25. The magnetic recording material of claim 21, wherein the magnetic layers comprise Co, the spacer layers comprise Pd, and the spacer layer additives and the magnetic layer additives comprise at least one element selected from Cr and B.

26. The magnetic recording material of claim 20, wherein the magnetic and spacer layers have average grain sizes of less than about 20 nm.

27. The magnetic recording material of claim 20, wherein the hard magnetic recording layer comprises from 2 to 10 layers of each of the magnetic material and spacer material.

28. The magnetic recording material of claim 20, wherein each magnetic layer has a thickness of from about 0.1 to about 10 nm, and each spacer layer has a thickness of from about 1 to about 20 nm.

29. A method of making a magnetic recording material, the method comprising depositing alternating layers of exchange decoupled magnetic material and exchange decoupled spacer material, wherein the layers of magnetic material consist essentially of magnetic grains and the layers of spacer material comprise from about 0.001 to about 30 weight percent additives which form grain boundaries in the spacer material to thereby produce said exchange decoupling.

30. The method of claim 29, wherein the magnetic layers comprise additives which exchange decouple the magnetic layers.

31. The method of claim 30, wherein the magnetic layers comprise at least one metal selected from Co, Ni and Fe, the spacer layers comprise at least one metal selected from Pd and Pt, and the spacer layer additives and the magnetic layer additives comprise at least one material selected from Cr, Pt, B, Ta, Nb, Y, La, rare earth elements and $SiO_2$.

32. The method of claim 30, wherein the magnetic layers comprise Co, the spacer layers comprise Pd, and the spacer layer additives and the magnetic layer additives comprise at least one element selected from Cr and B.

33. The method of claim 29, wherein the magnetic and spacer layers have average grain sizes of less than about 20 nm.

34. A magnetic recording media comprising:
a substrate; and
a hard magnetic recording layer on the substrate comprising alternating layers of magnetic material and spacer material, wherein the layers of magnetic material consist essentially of magnetic grains and comprise additives which exchange decouple the magnetic layers, the layers of spacer material comprise additives which form grain boundaries in the spacer material to thereby exchange decouple the spacer material, and the spacer layer additives and the magnetic layer additives comprise a total of from about 0.001 to about 30 weight percent Cr, Pt, B, Ta, Nb, Y, La, rare earth elements, $SiO_2$ or combinations thereof.

35. A magnetic recording media comprising:
a substrate; and
a hard magnetic recording layer on the substrate comprising alternating layers of magnetic material and spacer material, wherein the layers of magnetic material consist essentially of magnetic grains and comprise additives which exchange decouple the magnetic layers, the layers of spacer material comprise additives which form grain boundaries in the spacer material to thereby exchange decouple the spacer material, and the spacer layer additives and the magnetic layer additives are substantially the same in both the magnetic layers and spacer layers.

36. A magnetic recording media comprising:
a substrate; and
a hard magnetic recording layer on the substrate comprising alternating layers of magnetic material and spacer material, wherein the layers of magnetic material consist essentially of magnetic grains, the layers of spacer material comprise additives which form grain boundaries in the spacer material to thereby exchange decouple the spacer material, and the spacer layers have average grain sizes of from about 1 to about 10 nm.

37. A magnetic recording media comprising:
a substrate;
a hard magnetic recording layer on the substrate comprising alternating layers of magnetic material and spacer material, wherein the layers of magnetic material consist essentially of magnetic grains and the layers of spacer material comprise additives which form grain boundaries in the spacer material to thereby exchange decouple the spacer material; and
a soft magnetic layer between the substrate and the hard magnetic recording layer.

* * * * *